United States Patent
Taniguchi et al.

(10) Patent No.: US 8,618,958 B2
(45) Date of Patent: Dec. 31, 2013

(54) NAVIGATION DEVICE

(75) Inventors: Takuya Taniguchi, Tokyo (JP); Takahisa Aoyagi, Tokyo (JP); Yoshihiko Mori, Tokyo (JP); Asako Omote, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 157 days.

(21) Appl. No.: 13/127,405

(22) PCT Filed: Aug. 11, 2009

(86) PCT No.: PCT/JP2009/003861
§ 371 (c)(1),
(2), (4) Date: May 3, 2011

(87) PCT Pub. No.: WO2010/070781
PCT Pub. Date: Jun. 24, 2010

(65) Prior Publication Data
US 2011/0213553 A1 Sep. 1, 2011

(30) Foreign Application Priority Data
Dec. 16, 2008 (JP) ................................. 2008-319775

(51) Int. Cl.
*G01C 21/36* (2006.01)
(52) U.S. Cl.
USPC .................................... 340/995.23

(58) Field of Classification Search
USPC ......................................................... 701/211
See application file for complete search history.

(56) References Cited

U.S. PATENT DOCUMENTS

| | | | | |
|---|---|---|---|---|
| 4,827,520 A | * | 5/1989 | Zeinstra | 701/1 |
| 5,278,895 A | * | 1/1994 | Carlson | 379/88.25 |
| 5,898,392 A | * | 4/1999 | Bambini et al. | 340/996 |
| 2007/0219786 A1 | * | 9/2007 | Isaac et al. | 704/201 |

FOREIGN PATENT DOCUMENTS

| | | |
|---|---|---|
| JP | 60-41863 A | 3/1985 |
| JP | 5-103076 A | 4/1993 |
| JP | 11-196464 A | 7/1999 |
| JP | 2002-257574 A | 9/2002 |
| JP | 2005-114521 A | 4/2005 |
| JP | 2007-235328 A | 9/2007 |

\* cited by examiner

*Primary Examiner* — Mary Cheung
*Assistant Examiner* — Michael Berns
(74) *Attorney, Agent, or Firm* — Birch, Stewart, Kolasch & Birch, LLP (57) ABSTRACT

A navigation device includes a communication module 11 for transmitting and receiving a signal to and from external communication equipment, a tone signal identifying unit 42 for identifying a push tone signal sent thereto via the communication module 11 from the external communication equipment, and a voice recognition unit 41 for performing voice recognition on a voice signal sent thereto via the communication module 11 from the external communication equipment by using information identified by the tone signal identifying unit 42.

5 Claims, 6 Drawing Sheets

NAVIGATION DEVICE

FIELD OF THE INVENTION

The present invention relates to a navigation device that guides a user to his or her destination. More particularly, it relates to a technology of extracting a point or the like automatically by recognizing a call partner's voice.

BACKGROUND OF THE INVENTION

Conventionally, a navigation device equipped with a voice recognition function is known. In this navigation device, the user is not allowed to make a hands-free telephone call during voice recognition because voices other than a voice to be recognized have to be prevented from being recognized accidentally. In order to solve this problem, patent reference 1 discloses a vehicle-mounted information device that can carry out voice recognition even if the user is making a hands-free telephone call.

This vehicle-mounted information device is provided with a communication unit that can carry out communications with the party on the other end of the connection via a network, a voice recognition unit for recognizing a voice inputted thereto via a microphone, a main processing unit for controlling a navigation function of providing road information according to the voice recognized by the voice recognition unit, and the communication operation of the communication unit, and a recognition switch for switching whether or not to use the voice inputted via the microphone as an object for the voice recognition by the voice recognition unit, and the communication unit consists of a mobile phone that can carry out data communications and make a voice call. The voice inputted via the microphone is sent to the mobile phone as an object for voice call, and to the voice recognition unit an object for voice recognition, and, when the switch for recognition is switched to a voice recognition position during a voice call of the mobile phone, the main processing unit causes the vehicle-mounted information device to perform the navigation function according to the voice recognized by the voice recognition unit, and, when the switch for recognition is switched to a return position, returns the vehicle-mounted information device to the voice call of the mobile phone.

RELATED ART DOCUMENT

Patent reference

Patent reference 1: JP, 2002-257574, A

SUMMARY OF THE INVENTION

While the vehicle-mounted information device disclosed by above-mentioned patent reference 1 can recognize a voice uttered by the user of the navigation device during a hands-free telephone call, the vehicle-mounted information device cannot recognize the call partner's voice. Therefore, the vehicle-mounted information device cannot perform voice recognition directly on point information provided by the call partner to register the point information into the navigation device. Therefore, the user of the navigation device keeps in mind point information, such as a spot name, which the user has heard from the call partner, and needs to cause the vehicle-mounted information device to perform voice recognition on the point information another time, and therefore it takes time and effort for user to cause the vehicle-mounted information device to perform voice recognition. Therefore, the development of a navigation device that can recognize directly point information heard from the call partner has been desired.

The present invention is made in order to meet the above-mentioned request, and it is an object of the present invention to provide a navigation device that can recognize a call partner's voice to acquire point information or personal information.

In accordance with the present invention, there is provided a navigation device including: a communication module for transmitting and receiving a signal to and from external communication equipment; a tone signal identifying unit for identifying a push tone signal sent thereto via the communication module from the external communication equipment; a voice recognition unit for performing voice recognition on a voice signal sent thereto via the communication module from the above-mentioned external communication equipment by using information identified by the above-mentioned tone signal identifying unit; and a sound volume control unit for, when receiving the voice signal from the above-mentioned external communication equipment via the above-mentioned communication module, reducing a sound volume of a transmission voice transmitted to the above-mentioned external communication equipment.

Therefore, the navigation device in accordance with the present invention enables the call partner to clearly hear voice guidance during the voice recognition.

EMBODIMENTS OF THE INVENTION

Hereafter, in order to explain this invention in greater detail, the preferred embodiments of the present invention will be described with reference to the accompanying drawings.

Embodiment 1

Figure 1:
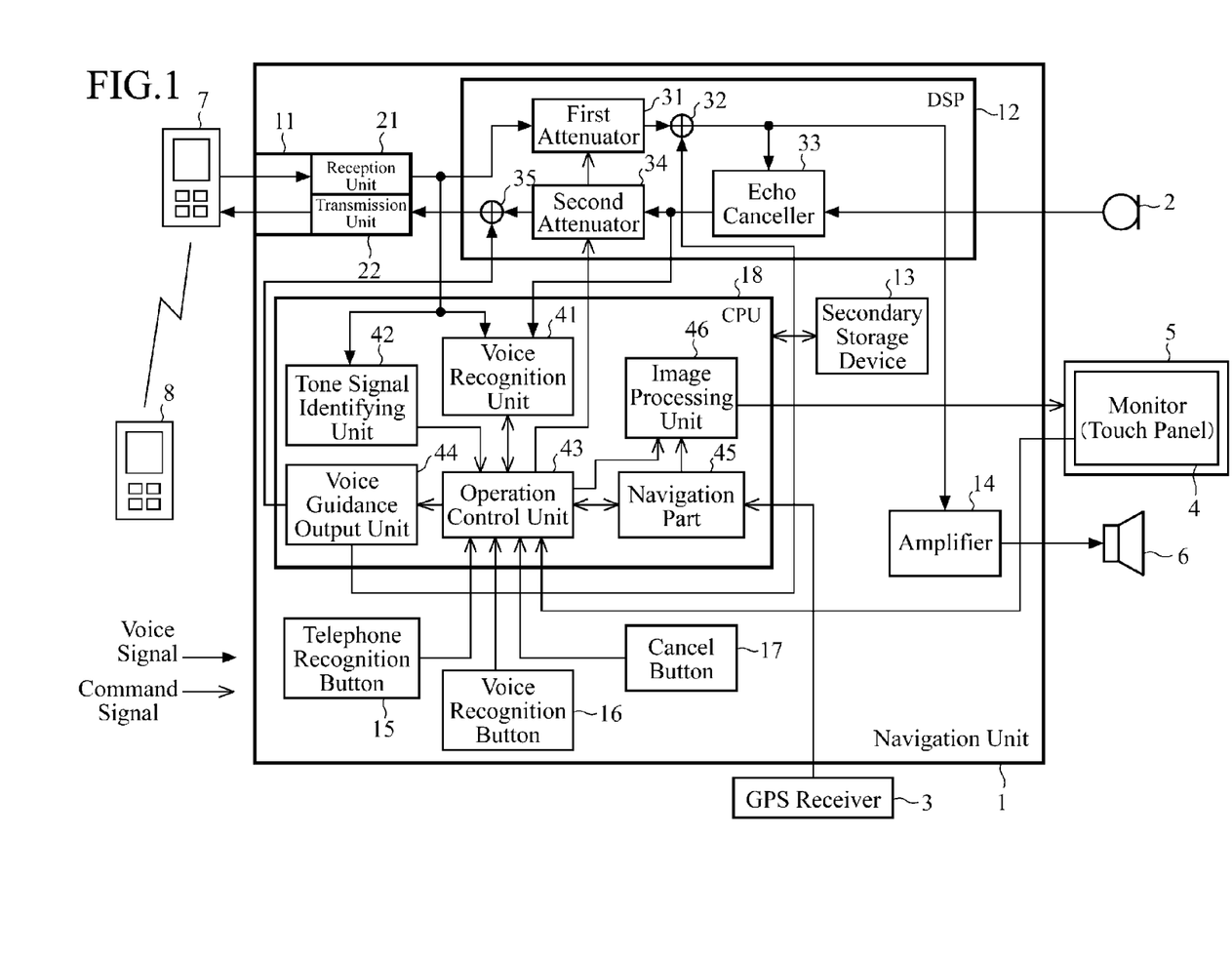
FIG. 1 is a block diagram showing the structure of a navigation device in accordance with Embodiment 1 of the present invention.

FIG. 1 is a block diagram showing the structure of a navigation device in accordance with Embodiment 1 of the present invention. This navigation device is provided with a navigation unit 1, a microphone 2, a GPS (Global Positioning System) receiver 3, a touch panel 4, a monitor 5, and a speaker 6. A mobile phone 7 is connected to this navigation unit 1.

The navigation unit 1 forms the heart of the navigation device, and controls the whole of the navigation device. The details of this navigation unit 1 will be mentioned below. The microphone 2 is used both for transmission and for voice recognition. This microphone 2 converts an inputted voice into an electric signal, and sends this electric signal to the navigation unit 1 as a voice signal.

The GPS receiver 3 receives radio waves transmitted from GPS satellites to detect the current position thereof. The current position of this GPS receiver 3 detected by the GPS receiver is informed to the navigation unit 1 as a current position signal. The touch panel 4 is placed on the screen of the monitor 5, and detects a position touched. This detected position is informed to the navigation unit 1 as touch panel data.

The monitor 5 is comprised of a liquid crystal panel, for example, and displays various images according to an image signal sent thereto from the navigation unit 1. The speaker 6 is used both for telephone reception and for voice guidance. This speaker 6 converts the voice signal sent thereto from the navigation unit 1 into a voice, and outputs this voice.

While the mobile phone 7 transmits and receives a signal including a voice or data to and from the navigation unit 1, and communicates with a call partner's mobile phone 8. These mobile phones 7 and 8 correspond to external communication equipment in accordance with the present invention.

Next, the details of the navigation unit 1 will be explained. The navigation unit 1 is provided with a communication module 11, a DSP (Digital Signal Processor) 12, a secondary storage device 13, an amplifier 14, a telephone recognition button 15, a voice recognition button 16, a cancel button 17, and a CPU (Central Processing Unit) 18.

The communication module 11 is comprised of a Bluetooth module or a telephone connector, and is provided with a reception unit 21 and a transmission unit 22. The reception unit 21 receives a signal sent thereto from the mobile phone 7, and sends the signal to the DSP 12 and the CPU 18 as a reception signal. The transmission unit 22 receives a transmission signal sent thereto from the DSP 12, and sends the transmission signal to the mobile phone 7.

The DSP 12 mixes a guiding voice for a navigation function or the like into each of a transmission voice and a reception voice. As a result, while the navigation unit can send the transmission voice and the guiding voice to the call partner, the navigation unit can output the reception voice and the guiding voice to a user using this navigation device (simply referred to as the "user" from here on).

This DSP 12 is provided with a first attenuator 31, a first mixer 32, an echo canceller 33, a second attenuator 34, and a second mixer 35. The first attenuator 31 and the second attenuator 34 correspond to a sound volume control unit in accordance with the present invention.

The first attenuator 31 attenuates the reception signal sent thereto from the reception unit 21 of the communication module 11 according to a command from the CPU 18, and sends the reception signal attenuated thereby to the first mixer 32. Because this first attenuator 31 can reduce the sound volume of the reception voice, the navigation device can prevent the user's voice from being misrecognized in the voice recognition, and can also raise the articulation of the guiding voice provided for the user.

The first mixer 32 mixes the reception signal sent thereto from the first attenuator 31 and the guiding voice signal sent thereto from the CPU 18 to generate a signal, and sends this signal to the echo canceller 33 and the amplifier 14. The echo canceller 33 removes a sound component which is outputted from the speaker 6 and diffracted into the microphone 2 from the voice signal sent thereto from the microphone 2, and sends this voice signal from which the sound component has been removed to the second attenuator 34 and the CPU 18. This echo canceller 33 can prevent the guiding voice and the reception voice which are outputted from the speaker 6 from entering the transmission voice at the time of a hands-free telephone call or the like. Simultaneously, this echo canceller 33 can also prevent the reception voice outputted from the speaker 6 from being sent to the CPU 18. As a result, the navigation device can prevent a voice uttered by the user during a hands-free telephone call from being misrecognized in performing voice recognition on the voice.

The second attenuator 34 attenuates the signal sent thereto from the echo canceller 33 according to a command from the CPU 18, and sends the signal attenuated thereby to the second mixer 35. Because this second attenuator 34 can reduce the sound volume of the transmission voice, the navigation device can make it easy for the call partner to hear the guiding voice during the voice recognition. The second mixer 35 mixes the signal sent thereto from the second attenuator 34 and the guiding voice signal sent thereto from the CPU 18 to generate a signal, and sends this signal to the transmission unit 22 of the communication module 11.

The secondary storage device 13 is comprised of an HDD (Hard Disk Drive), for example, and stores map data for navigation and dictionary data for voice recognition. The map data and the dictionary data which are stored in this secondary storage device 13 are accessed by the CPU 18 as needed. The amplifier 14 amplifies a signal in which the reception signal sent thereto from the first mixer 32 of the DSP 12 and the guiding voice signal are mixed, and sends the signal to the speaker 6 as a voice signal.

The telephone recognition button 15 is used in order to cause the navigation device to start performing voice recognition on the call partner's voice. Telephone recognition button data generated by a pushdown of this telephone recognition button 15 is sent to the CPU 18. The voice recognition button 16 is used in order to cause the navigation device to start performing voice recognition on the user's voice. Voice recognition button data generated by a pushdown of this voice recognition button 16 is sent to the CPU 18. The cancel button 17 is used in order to cancel the result of voice recognition. Cancel button data generated by a pushdown of this cancel button 17 is sent to the CPU 18.

The CPU 18 is provided with a voice recognition unit 41, a tone signal identifying unit 42, an operation control unit 43, a voice guidance output unit 44, a navigation part 45, and an image processing unit 46. Each of these components is implemented by a program executed by the CPU 18. Each of these components can be alternatively implemented via hardware.

The voice recognition unit 41 performs voice recognition on the reception signal sent thereto via the reception unit 21 of the communication module 11 from the mobile phone 7 by using the dictionary data read from the secondary storage device 13. The voice recognition unit 41 also performs voice recognition on the voice signal sent thereto via the echo canceller 33 of the DSP 12 from the microphone 2 by using the dictionary data read from the secondary storage device 13. The voice recognition result acquired by this voice recognition unit 41, i.e., characters or a command which this voice recognition unit 41 has acquired by performing voice recognition on the reception signal or the voice signal is sent to the operation control unit 43 as voice recognition data.

The tone signal identifying unit 42 analyzes the push tone signal sent thereto via the reception unit 21 of the communication module 11 from the mobile phone 7 to recognize the button which has been pushed down in the mobile phone 8 connected to the mobile phone 7 from the frequency of the signal. Tone signal identification data showing the button recognized by this tone signal identifying unit 42 is sent to the operation control unit 43.

The operation control unit 43 accepts the voice recognition data sent thereto from the voice recognition unit 41, the tone signal identification data sent thereto from the tone signal identifying unit 42, the telephone recognition button data sent thereto from the telephone recognition button 15, the voice recognition button data sent thereto from the voice recognition button 16, the cancel button data sent thereto from the cancel button 17, the touch panel data sent thereto from the touch panel 4, and a request command from the navigation part 45, and performs a predetermined process. The operation control unit then controls the voice guidance output unit 44, the navigation part 45, the image processing unit 46, and the first attenuator 31 and the second attenuator 34 of the DSP 12 according to the result of the process.

The voice guidance output unit 44 creates a guiding voice signal in response to a command from the operation control unit 43, and sends the guiding voice signal to the first mixer 32 and the second mixer 35 of the DSP 12. As a result, because the transmission signal in which the guiding voice is mixed into the transmission voice is sent to the mobile phone 7, the voice guidance output unit can output the voice guidance to the call partner. Furthermore, because the signal in which the guiding voice is mixed into the reception signal from the mobile phone 7 is outputted from the speaker 6, the voice guidance output unit can output the voice guidance to the user.

The navigation part 45 performs a process of implementing a navigation function in response to a command from the operation control unit 43. For example, the navigation part 45 makes a setting of a destination and waypoints or registration of a point. Furthermore, the navigation part acquires the result of voice recognition by making a request of the operation control unit 43, and then performs a process such as a route search or route guidance, and causes the navigation unit to output voice guidance. Furthermore, when displaying a map, the navigation part issues a command to the image processing unit 46 to cause this image processing unit to display the map on the monitor 5. In addition, when carrying out navigation, the navigation part acquires the current position signal from the GPS receiver 3 to determine the vehicle position.

The image processing unit 46 creates an image for displaying the result of voice recognition, a map, or other information required for navigation in response to a command from the navigation unit 45 and a command from the operation control unit 43, and sends the image to the monitor 5 as an image signal. As a result, the result of voice recognition, the map, or the other information required for navigation is displayed on the monitor 5.

Figure 2:
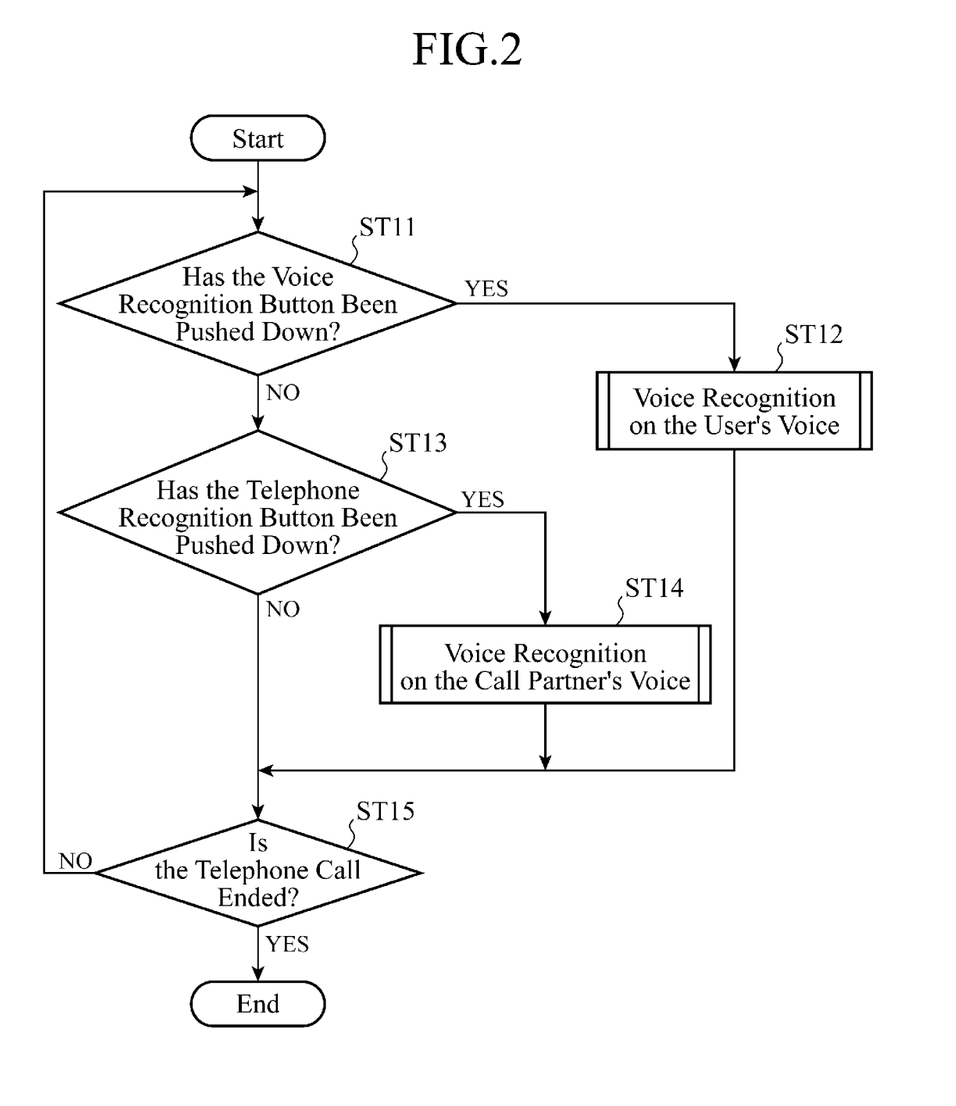
FIG. 2 is a flow chart showing hands-free call processing carried out by the navigation device in accordance with Embodiment 1 of the present invention.
Figure 3:
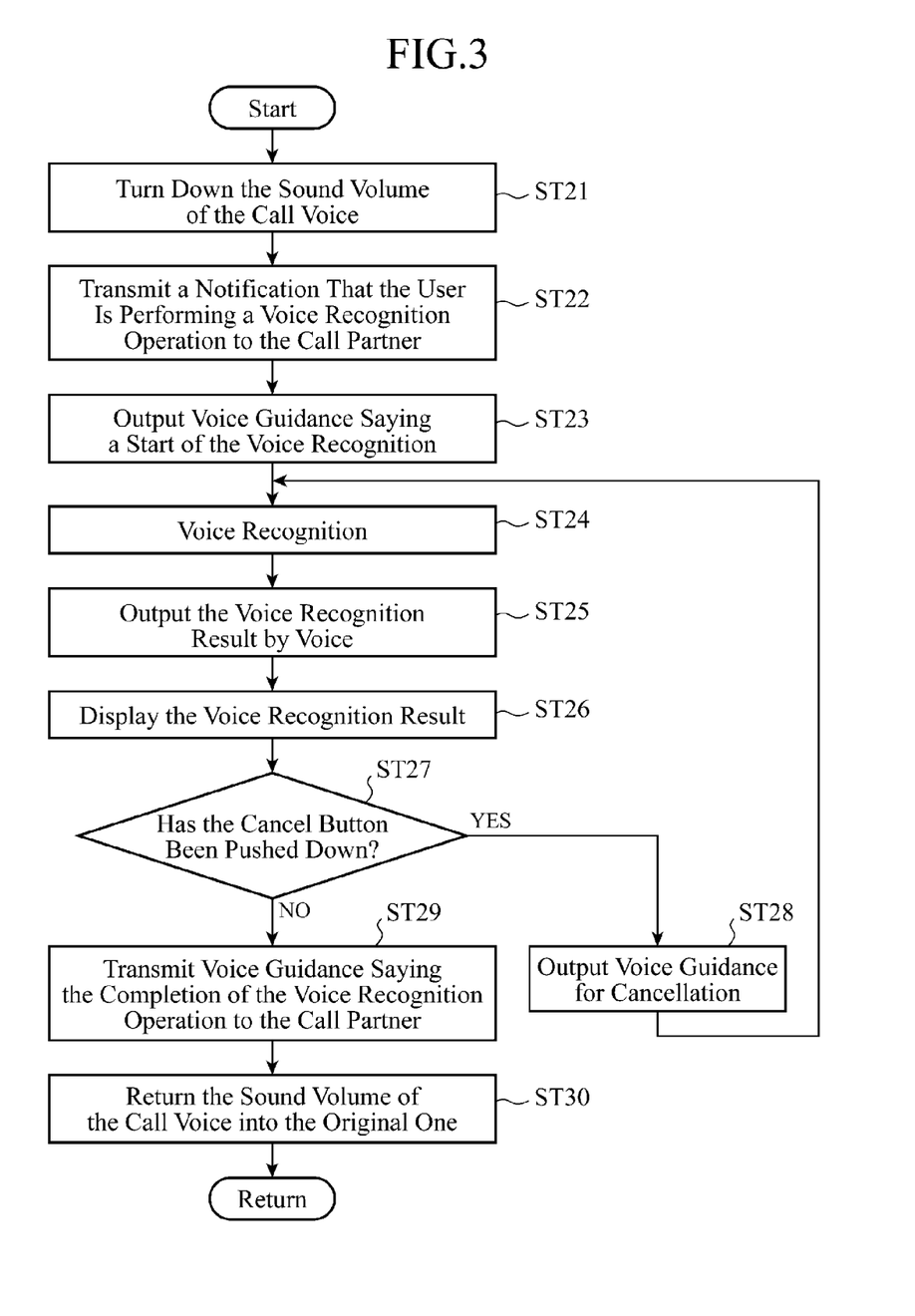
FIG. 3 is a flow chart showing the details of voice recognition processing on a voice uttered by a user during the hands-free call processing, which is carried out by the navigation device in accordance with Embodiment 1 of the present invention.
Figure 4:
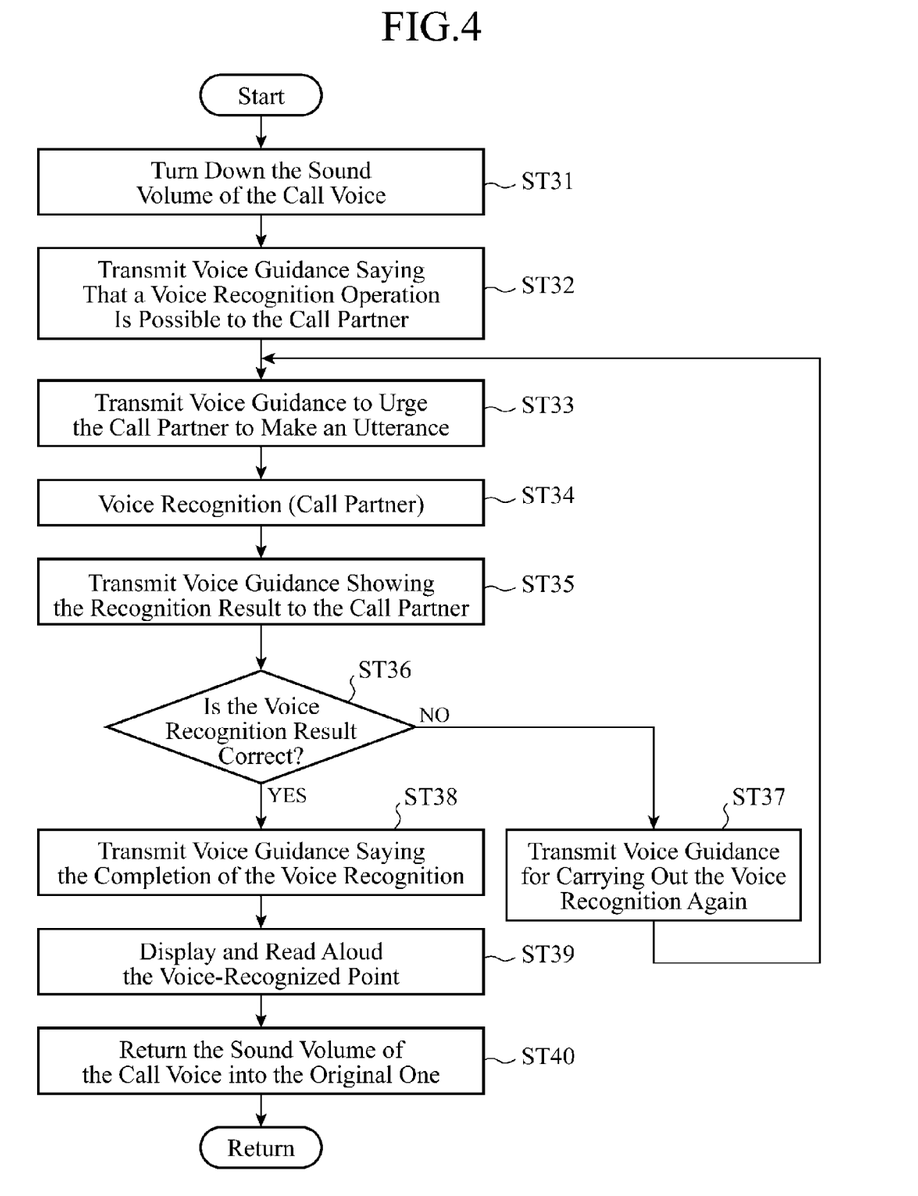
FIG. 4 is a flow chart showing the details of voice recognition processing on a voice uttered by a call partner during the hands-free call processing, which is carried out by the navigation device in accordance with Embodiment 1 of the present invention.

Next, the operation of the navigation device in accordance with Embodiment 1 of the present invention constructed as mentioned above will be explained with reference to flow charts shown in FIGS. 2 to 4, focusing on hands-free call processing for implementing a hands-free telephone call. The hands-free call processing is started by either calling by the user or an incoming call from the call partner's mobile phone 8.

When the hands-free call processing is started, whether the voice recognition button 16 has been pushed down is checked to see first (step ST11). More specifically, the operation control unit 43 of the CPU 18 checks to see whether voice recognition button data has been sent thereto from the voice recognition button 16. When, in this step ST11, determining that the voice recognition button 16 has been pushed down, the navigation device performs voice recognition on the user's voice (step ST12). The details of the process of this step ST12 will be mentioned below. After that, the navigation device advances the sequence to step ST15.

In contrast, when it is determined, in step ST11, that the voice recognition button 16 has not been pushed down, whether the telephone recognition button 15 has been pushed down is then checked to see (step ST13). More specifically, the operation control unit 43 of the CPU 18 checks to see whether telephone recognition button data has been sent thereto from the telephone recognition button 15. When, in this step ST13, determining that the telephone recognition button 15 has been pushed down, the navigation device performs voice recognition on the call partner's voice (step ST14). The details of the process of this step ST14 will be mentioned below. After that, the navigation device advances the sequence to step ST15. Also when, in above-mentioned step ST13, determining that the telephone recognition button 15 has not been pushed down, the navigation device advances the sequence to step ST15.

In step ST15, whether the telephone call has been ended is checked to see. More specifically, the operation control unit 43 checks to see whether touch panel data showing that an operation of ending the telephone call has been performed has been sent from the touch panel 4 and whether the communications between the mobile phone 7 and the mobile phone 8 has been disconnected. When, in this step ST15, determining that the telephone call has not been ended, the navigation device returns the sequence to step ST11 and repeats the above-mentioned processes. In contrast, when, in step ST15, determining that the telephone call has been ended, the navigation device ends the hands-free call processing.

Next, the details of the voice recognition processing on the user's voice which is carried out in above-mentioned step ST12 will be explained with reference to the flow chart shown in FIG. 3.

In the voice recognition processing on the user's voice, the sound volume of the call voice (this call voice means both the "transmission voice" and the "reception voice") is reduced first (step ST21). More specifically, the operation control unit 43 commands the first attenuator 31 and the second attenuator 34 to turn down the voice. As a result, the first attenuator 31 attenuates the reception signal sent thereto from the reception unit 21 of the communication module 11, and sends the reception signal attenuated thereby to the first mixer 32. Furthermore, the second attenuator 34 attenuates the signal sent thereto from the echo canceller 33, and sends the signal attenuated thereby to the second mixer 35. As a result, the sound volume of the transmission voice transmitted to the call partner and that of the reception voice from the call partner are turned down.

Then, the navigation device transmits voice guidance saying that the user is performing a voice recognition operation to the call partner (step ST22). More specifically, the operation control unit 43 commands the voice guidance output unit 44 to create voice guidance saying that the user is performing a voice recognition operation. In response to this command, the voice guidance output unit 44 creates a guiding voice signal showing that the user is performing a voice recognition operation, and sends the guiding voice signal to the second mixer 35 of the DSP 12. The second mixer 35 mixes the signal sent thereto from the second attenuator 34 and the guiding voice signal sent thereto from the voice guidance output unit 44 to generate a signal, and sends this signal to the mobile phone 7 via the transmission unit 22 of the communication module 11. The mobile phone 7 transmits the guiding voice signal sent thereto from the transmission unit 22 to the call partner's mobile phone 8. As a result, the call partner's mobile phone 8 outputs the voice guidance saying that the user is performing a voice recognition operation. For example, the call partner's mobile phone outputs such voice guidance as "Voice recognition operation is being performed. Hold on a moment, please".

Voice guidance to command a start of voice recognition is then outputted (step ST23). More specifically, the operation control unit 43 commands the voice guidance output unit 44 to create voice guidance showing a start of voice recognition. In response to this command, the voice guidance output unit 44 creates a guiding voice signal showing voice guidance to command a start of voice recognition, and sends the guiding voice signal to the first mixer 32 of the DSP 12. The first mixer 32 mixes the signal sent thereto from the first attenuator 31 and the guiding voice signal sent thereto from the voice guidance output unit 44 to generate a signal, and sends this signal to the amplifier 14. The amplifier 14 amplifies the signal in which the reception signal sent from the first mixer 32 and the guiding voice signal are mixed, and sends the signal amplified thereby to the speaker 6 as a voice signal. As a result, the speaker 6 outputs voice guidance to command a start of voice recognition. For example, the speaker outputs such voice guidance as "Voice recognition will be started. Please speak after the beep".

Through the above-mentioned processes in steps ST21 to ST23, the voice guidance showing that the user is performing a voice recognition operation is delivered to the call partner. Furthermore, both the user and the call partner can concentrate on listening the voice guidance because the sound volume of the partner's voice is reduced.

Voice recognition on the user's voice is then carried out (step ST24). More specifically, the voice recognition unit 41 performs voice recognition on the voice signal sent thereto via the echo canceller 33 from the microphone 2 by using the dictionary data read from the secondary storage device 13, and sends characters or a command, which the voice recognition unit has acquired, to the operation control unit 43 as voice recognition data.

The voice recognition result is then outputted by voice (step ST25). More specifically, the operation control unit 43 commands the voice guidance output unit 44 to create voice guidance showing the voice recognition result. The voice guidance output unit 44 creates a guiding voice signal including the characters or the command shown by the voice recognition data in response to this command, and sends the guiding voice signal to the first mixer 32 of the DSP 12. The first mixer 32 mixes the signal sent thereto from the first attenuator 31 and the guiding voice signal sent thereto from the voice guidance output unit 44 to generate a signal, and sends this signal to the amplifier 14. The amplifier 14 amplifies the signal sent thereto from the first mixer 32, and sends the signal amplified thereby to the speaker 6 as a voice signal. As a result, the speaker 6 outputs the result of the voice recognition by voice.

The voice recognition result is then displayed (step ST26). More specifically, the operation control unit 43 commands the image processing unit 46 to create characters or a command showing the voice recognition result shown by the voice recognition data. The image processing unit 46 creates an image showing the characters or the command showing the voice recognition result in response to this command, and sends the image to the monitor 5 as an image signal. As a result, the result of the voice recognition is displayed on the monitor 5.

Whether the cancel button 17 has been pushed down is then checked to see (step ST27). More specifically, the operation control unit 43 checks to see whether cancel button data has been sent thereto from the cancel button 17. When it is determined, in this step ST27, that the cancel button 17 has been pushed down, it is recognized that the voice recognition result is incorrect and voice guidance showing cancellation is outputted (step ST28). More specifically, the operation control unit 43 commands the voice guidance output unit 44 to create voice guidance showing cancellation. The voice guidance output unit 44 creates a guiding voice signal showing cancellation in response to the command from the operation control unit 43, and sends the guiding voice signal to the first mixer 32 of the DSP 12. The first mixer 32 mixes the signal sent thereto from the first attenuator 31 and the guiding voice signal sent thereto from the voice guidance output unit 44 to generate a signal, and sends this signal to the amplifier 14. The amplifier 14 amplifies the signal sent thereto from the first mixer 32, and sends the signal amplified thereby to the speaker 6 as a voice signal. As a result, the voice guidance showing cancellation is outputted from the speaker 6. Then, the navigation device returns the sequence to step ST24 and performs the voice recognition processing again.

When it is determined, in above-mentioned step ST27, that the cancel button 17 has not been pushed down, it is recognized that the voice recognition result is correct and voice guidance showing that the voice recognition operation is completed is transmitted to the call partner (step ST29). More specifically, the operation control unit 43 commands the voice guidance output unit 44 to create voice guidance showing that the voice recognition is completed. The voice guidance output unit 44 creates a guiding voice signal showing the voice guidance showing that the voice recognition is completed in response to this command, and sends the guiding voice signal to the second mixer 35 of the DSP 12. The second mixer 35 mixes the signal sent thereto from the second attenuator 34 and the guiding voice signal sent thereto from the voice guidance output unit 44 to generate a signal, and sends this signal to the mobile phone 7 via the transmission unit 22 of the communication module 11. The mobile phone 7 transmits the guiding voice signal sent thereto from the transmission unit 22 to the call partner's mobile phone 8. As a result, the call partner's mobile phone 8 outputs the voice guidance showing that the voice recognition on the user's voice has been completed, for example, such voice guidance as "The voice recognition operation is ended".

The sound volume of the call voice is then returned to the original one (step ST30). More specifically, the operation control unit 43 commands the first attenuator 31 and the second attenuator 34 to return the sound volume of the call voice to the original one. As a result, the first attenuator 31 returns the attenuation of the reception signal sent thereto from the reception unit 21 of the communication module 11 to its original value, and sends the reception signal attenuated thereby to the first mixer 32. Furthermore, the second attenuator 34 returns the attenuation of the signal sent thereto from the echo canceller 33 to its original value, and sends the signal attenuated thereby to the second mixer 35. As a result, the sound volumes of the transmission voice transmitted to the call partner and the reception voice from the call partner are returned to their original ones. After that, the navigation device returns the sequence to the hands-free call processing.

Next, the details of voice recognition processing on the call partner's voice which is carried out in above-mentioned step ST14 will be explained with reference to the flow chart shown in FIG. 4.

In the voice recognition processing on the call partner's voice, the sound volume of the call voice is turned down first (step ST31). The process in this step ST31 is the same as that in above-mentioned step ST21.

Voice guidance saying that it has become possible to perform a voice recognition operation is then transmitted to the call partner (step ST32). More specifically, the operation control unit 43 commands the voice guidance output unit 44 to create voice guidance saying that it has become possible to perform a voice recognition operation. The voice guidance output unit 44 creates a guiding voice signal showing that it has become possible to perform a voice recognition operation in response to this command, and sends the guiding voice signal to the second mixer 35 of the DSP 12. The second mixer 35 mixes the signal sent thereto from the second attenuator 34 and the guiding voice signal sent thereto from the voice guidance output unit 44 to generate a signal, and sends this signal to the mobile phone 7 via the transmission unit 22 of the communication module 11. The mobile phone 7 transmits the guiding voice signal sent thereto from the transmission unit 22 to the call partner's mobile phone 8. As a result, the call partner's mobile phone 8 outputs the voice guidance showing that it has become possible to perform a voice recognition operation, for example, such voice guidance as "You can input a location you want to register by voice".

Voice guidance for urging the call partner to make an utterance is then transmitted (step ST33). More specifically, the operation control unit 43 commands the voice guidance output unit 44 to create voice guidance to urge the call partner to make an utterance. The voice guidance output unit 44 creates a guiding voice signal showing voice guidance to urging the call partner to make an utterance in response to this command, and sends the guiding voice signal to the second mixer 35 of the DSP 12. The second mixer 35 mixes the signal sent thereto from the second attenuator 34 and the guiding voice signal sent thereto from the voice guidance output unit 44 to generate a signal, and sends this signal to the mobile phone 7 via the transmission unit 22 of the communication module 11. The mobile phone 7 transmits the guiding voice signal sent thereto from the transmission unit 22 to the call partner's mobile phone 8. As a result, the call partner's mobile phone 8 outputs the voice guidance showing that it has become possible to perform a voice recognition operation, for example, such voice guidance to command a selection of the type of words as "Speak after push 1 when searching by address and keyword, push 2 when searching by telephone number, or push 3 when searching by postal code number".

In the mobile phone 8 which is the call partner, in response to this voice guidance, the user using this mobile phone pushes down one of the buttons "1" to "3" in order to select the type of the content of an utterance which the user will make. As a result, a push tone signal according to the pushed-down button is generated and sent to the navigation unit 1 via the mobile phone 7. Furthermore, the mobile phone 8 generates a tone dial signal on a voluntary basis, and sends this tone dial signal to the navigation unit 1 via the mobile phone 7 to inform the navigation unit 1 that the mobile phone 8 is ready to receive an utterance. In the navigation unit 1, the push tone signal sent from the mobile phone 7 is sent to the tone signal identifying unit 42 via the reception unit 21 of the communication module 11. The tone signal identifying unit 42 analyzes the push tone signal sent thereto to recognize the pushed-down button, and informs this pushed-down button to the operation control unit 43 as tone signal identification data.

Voice recognition is then carried out (step ST34). More specifically, after imposing a constraint that voice recognition must be carried out within the bounds of the type of words shown by the tone signal identification data received from the tone signal identifying unit 42, the operation control unit 43 commands the voice recognition unit 41 to start voice recognition. The voice recognition unit 41 performs voice recognition on the reception signal which follows the push tone signal and which is sent thereto via the reception unit 21 of the communication module 11 from the mobile phone 7 by using the dictionary data read from the secondary storage device 13 to acquire characters or a command, and sends the acquired character or command to the operation control unit 43 as voice recognition data.

Voice guidance showing the recognition result is then transmitted to the call partner (step ST35). More specifically, the operation control unit 43 commands the voice guidance output unit 44 to create voice guidance showing the recognition result. The voice guidance output unit 44 creates a guiding voice signal including the characters or command shown by the voice recognition data in response to this command, and sends the guiding voice signal to the second mixer 35 of the DSP 12. The second mixer 35 mixes the signal sent thereto from the second attenuator 34 and the guiding voice signal sent thereto from the voice guidance output unit 44 to generate a signal, and sends this signal to the mobile phone 7 via the transmission unit 22 of the communication module 11. The mobile phone 7 transmits the guiding voice signal sent thereto from the transmission unit 22 to the call partner's mobile phone 8. Accordingly, in the call partner's mobile phone 8, the voice guidance showing the voice recognition result, for example, such voice guidance as "If you have uttered OOO, push 1, or otherwise push 2" is outputted.

Whether or not the recognition result is correct is then checked to see (step ST36). More specifically, when the button "1" or "2" is pushed down in the mobile phone 8 which is the call partner, a push tone signal according to the pushed-down button is generated and sent to the navigation unit 1 via the mobile phone 7. In the navigation unit 1, the push tone signal sent from the mobile phone 7 is sent to the tone signal identifying unit 42 via the reception unit 21 of the communication module 11. The tone signal identifying unit 42 analyzes the push tone signal sent thereto to recognize the pushed-down button, and informs this pushed-down button to the operation control unit 43 as tone signal identification data. The operation control unit 43 then checks to see whether the pushed-down button shown by the tone signal identification data shows "the recognition result is correct" (in the example of the above-mentioned voice guidance, whether or not the pushed-down button is "1").

When it is determined, in this step ST36, that the recognition result is incorrect, voice guidance showing that the voice recognition will be carried out again is transmitted to the call partner (step ST37). More specifically, the operation control unit 43 commands the voice guidance output unit 44 to create voice guidance showing that the voice recognition will be carried out again. The voice guidance output unit 44 creates a guiding voice signal showing that the voice recognition will be carried out again in response to this command, and sends the guiding voice signal to the second mixer 35 of the DSP 12. The second mixer 35 mixes the signal sent thereto from the second attenuator 34 and the guiding voice signal sent thereto from the voice guidance output unit 44 to generate a signal, and sends this signal to the mobile phone 7 via the transmission unit 22 of the communication module 11. The mobile phone 7 transmits the guiding voice signal sent thereto from the transmission unit 22 to the call partner's mobile phone 8. As a result, in the call partner's mobile phone 8, the voice guidance showing that the voice recognition will be carried out again, for example, such voice guidance as "Cancelled. Please speak again" is outputted. After that, the navigation device returns the sequence to step ST33 and then repeats the above-mentioned processing.

In contrast, when it is determined, in step ST36, that the recognition result is correct, voice guidance saying that the voice recognition has been completed is transmitted to the call partner (step ST38). More specifically, the operation control unit 43 commands the voice guidance output unit 44 to create voice guidance saying that the voice recognition has been completed. The voice guidance output unit 44 creates a guiding voice signal showing that the voice recognition has been completed in response to this command, and sends the guiding voice signal to the second mixer 35 of the DSP 12. The second mixer 35 mixes the signal sent thereto from the second attenuator 34 and the guiding voice signal sent thereto from the voice guidance output unit 44 to generate a signal, and sends this signal to the mobile phone 7 via the transmission unit 22 of the communication module 11. The mobile phone 7 transmits the guiding voice signal sent thereto from the transmission unit 22 to the call partner's mobile phone 8. Accordingly, in the call partner's mobile phone 8, the voice guidance showing that the voice recognition has been completed, for example, such voice guidance as "Registered" is outputted.

Then, the point which has been voice-recognized is displayed on the monitor 5 and is read out (step ST39). More specifically, the image processing unit 46 commands the operation control unit 43 to create a character string showing the voice recognition result (a character string showing the point) and a map of an area surrounding the point shown by the above-mentioned character string. The image processing unit 46 creates an image showing the characters which are the voice recognition result and an image of the map of the area surrounding the point shown by the above-mentioned character string in response to this command, and sends the images to the monitor 5 as an image signal. As a result, the character string showing the point which has been voice-recognized, and the map of the area surrounding the above-mentioned point are displayed on the monitor 5. Furthermore, the operation control unit 43 commands the voice guidance output unit 44 to create voice guidance showing the voice recognition result. The voice guidance output unit 44 creates a guiding voice signal showing the voice recognition result in response to this command, and sends the guiding voice signal to the first mixer 32 of the DSP 12. The first mixer 32 mixes the signal sent thereto from the first attenuator 31 and the guiding voice signal sent thereto from the voice guidance output unit 44 to generate a signal, and sends this signal to the amplifier 14. The amplifier 14 amplifies the signal sent thereto from the first mixer 32, and sends the signal amplified thereby to the speaker 6 as a voice signal. As a result, the voice guidance showing the voice recognition result is outputted from the speaker 6.

The sound volume of the call voice is then returned to the original one (step ST40). The process in this step ST40 is the same as that in above-mentioned step ST30. After that, the navigation device returns the sequence to the hands-free call processing.

As explained above, the navigation device in accordance with Embodiment 1 of the present invention can perform not only voice recognition on the user's voice during a telephone call, but also voice recognition on the call partner's voice.

Furthermore, because the navigation device in accordance with Embodiment 1 of the present invention can present the recognition result to the call partner to enable the call partner to judge whether or not the recognition result is correct, and can also provide voice guidance to request the call partner to speak again when the recognition result is incorrect, the navigation device can provide a voice recognition result which the call partner intends to offer.

Embodiment 2

A navigation device in accordance with Embodiment 2 of the present invention has the same structure as that in accordance with above-mentioned Embodiment 1.

Next, the operation of the navigation device in accordance with Embodiment 2 will be explained. Hands-free call processing and voice recognition processing on a user's voice which are carried out by the navigation device in accordance with this Embodiment 2 are the same as the hands-free call processing (refer to FIG. 2) and the voice recognition processing on a user's voice (refer to FIG. 3) which are carried out by the navigation device in accordance with Embodiment 1, respectively.

Figure 5:
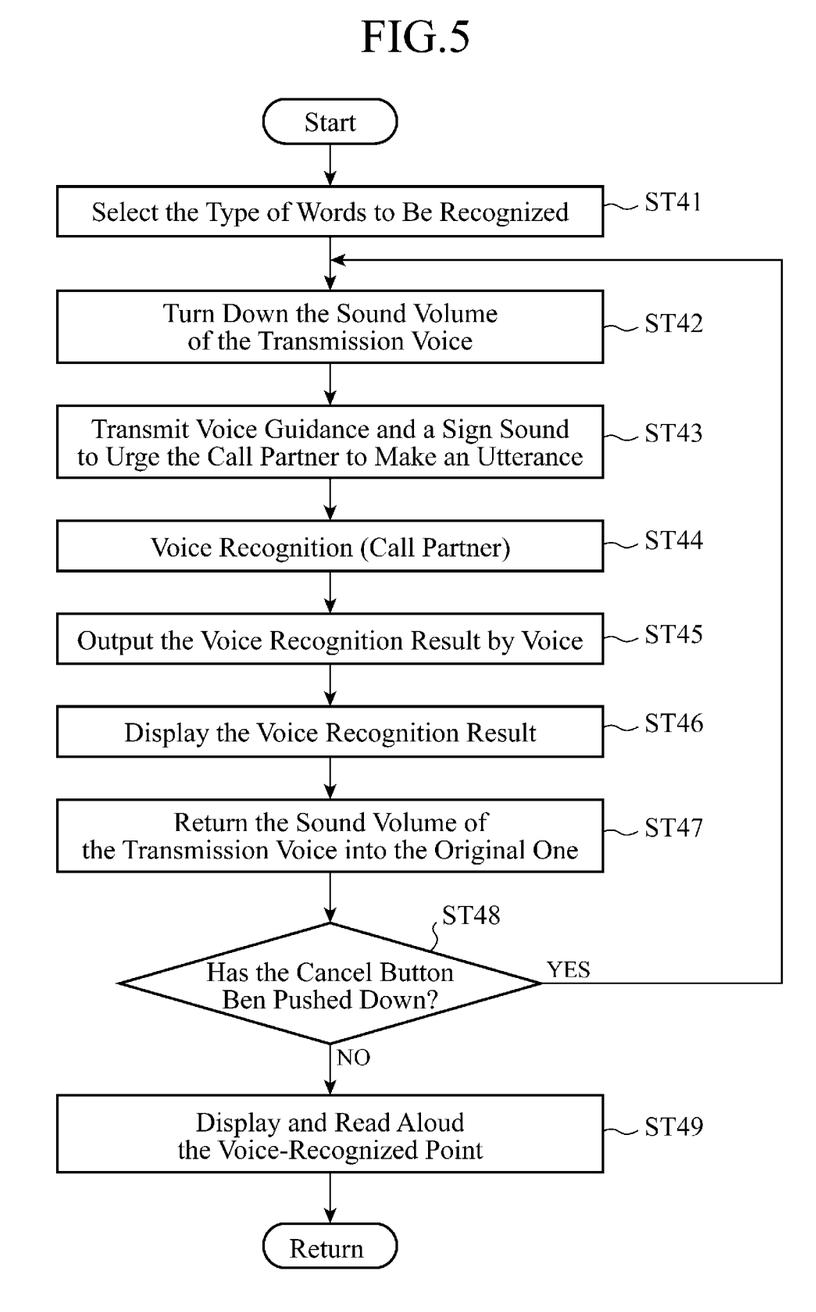
FIG. 5 is a flow chart showing the details of voice recognition processing on a voice uttered by a call partner during hands-free call processing, which is carried out by a navigation device in accordance with Embodiment 2 of the present invention.

FIG. 5 is a flow chart showing voice recognition processing on a call partner's voice which is carried out by the navigation device in accordance with Embodiment 2.

In the voice recognition processing on the call partner's voice, the type of words which the user causes the navigation device to recognize is selected first by the user (step ST41). More specifically, the user operates a touch panel 4 to select the type of the words which the user causes the navigation device to recognize. In this case, the touch panel 4 corresponds to a selecting unit in accordance with the present invention. An operation control unit 43 receives touch panel data sent thereto from the touch panel 4 in response to this selection operation, and determines the type of the words which are the target of voice recognition.

The sound volume of a transmission voice transmitted to the call partner is then turned down (step ST42). More specifically, the operation control unit 43 commands a second attenuator 34 to turn down the sound volume of the voice. The second attenuator 34 attenuates a signal sent thereto from an echo canceller 33 in response to this command, and sends the signal attenuated thereby to a second mixer 35. As a result, the sound volume of the transmission voice transmitted to the call partner is turned down.

Voice guidance to urge an utterance and a sign sound are then transmitted to the call partner (step ST43). More specifically, the operation control unit 43 commands a voice guidance output unit 44 to create voice guidance to urging the call partner to make an utterance, and a sign sound. The voice guidance output unit 44 creates a guiding voice signal showing the voice guidance to urge the call partner to make an utterance and the sign sound in response to this command, and sends the guiding voice signal to the second mixer 35 of a DSP 12. The second mixer 35 mixes the signal sent thereto from the second attenuator 34 and the guiding voice signal sent thereto from the voice guidance output unit 44 to generate a signal, and sends this signal to a mobile phone 7 via a transmission unit 22 of a communication module 11. The mobile phone 7 transmits the guiding voice signal sent thereto from the transmission unit 22 to the call partner's mobile phone 8. As a result, in the call partner's mobile phone 8, the voice guidance saying that it has become possible to perform a voice recognition operation, for example, such voice guidance as "Speak an address after the beep" and a beeping sign sound are outputted.

When the call partner speaks in response to this voice guidance, a voice signal is sent to a navigation unit 1 via the mobile phone 7 from the mobile phone 8. In the navigation unit 1, the voice signal sent from the mobile phone 7 is sent to a voice recognition unit 41 via a reception unit 21 of the communication module 11.

Voice recognition on the call partner's voice is then carried out (step ST44). More specifically, the voice recognition unit 41 performs voice recognition on a reception signal sent thereto via the reception unit 21 of the communication module 11 from the mobile phone 7 by using dictionary data read from a secondary storage device 13 to acquire characters or a command, and sends the acquired character or command to the operation control unit 43 as voice recognition data. In this case, because voice guidance is inserted into the transmission voice transmitted to the call partner with the sound volume of the transmission voice being reduced, the navigation device can make it easy for the call partner to hear the voice guidance.

The voice recognition result is then outputted by voice (step ST45). The process in this step ST45 is the same as that in above-mentioned step ST25. The voice recognition result is then displayed (step ST46). The process in this step ST46 is the same as that in above-mentioned step ST26.

The sound volume of the transmission voice is then returned to its original one (step ST47). More specifically, the operation control unit 43 commands the second attenuator 34 to return the sound volume of the voice to its original one. As a result, the second attenuator 34 returns the attenuation of the signal sent thereto from the echo canceller 33 to its original value, and sends the signal attenuated thereby to the second mixer 35. As a result, the sound volumes of the transmission voice transmitted to the call partner and the reception voice from the call partner are returned to their original ones.

Whether a cancel button 17 has been pushed down is then checked to see (step ST48). The process in this step ST48 is the same as that in above-mentioned step ST27. When it is determined, in this step ST48, that the cancel button 17 has been pushed down, it is recognized that the voice recognition result is incorrect, and the navigation device returns the sequence to step ST42 and carries out the voice recognition again.

In contrast, when it is determined, in step ST48, that the cancel button 17 has not been pushed down, it is recognized that the voice recognition result is correct, and the point which has been voice-recognized is displayed on a monitor 5 and is read out (step ST49). The process in this step ST49 is the same as that in above-mentioned step ST39. After that, the navigation device returns the sequence to the hands-free call processing.

As previously explained, because the navigation device in accordance with Embodiment 2 of the present invention can reduce the time required to provide voice guidance for the call partner compared with the navigation device in accordance with Embodiment 1, the navigation device in accordance with Embodiment 2 can reduce the time interval during which the telephone call with the call partner is impossible during the voice recognition.

Furthermore, because the sound volume of the reception voice from the call partner is not reduced during the voice recognition, the user can clearly hear the call partner's voice (the voice which is the target of voice recognition). Therefore, because the user can understand the words which the call partner has tried to cause the navigation device to recognize even if the voice recognition on the call partner's voice fails, the navigation device can carry out the voice recognition operation according to the user's own utterance, and therefore does not have to request the call partner to perform the troublesome voice recognition operation again.

In addition, because the navigation device in accordance with Embodiment 2 does not have to include the tone signal identifying unit 42 included in the CPU 18, the structure of the CPU 18 can be simplified.

The navigation device in accordance with any one of above-mentioned Embodiments 1 and 2 can be constructed in such a way as to, when an operation for voice recognition is started or ended in the mobile phone 8, output a voice saying that the call partner is performing a voice recognition operation from the speaker 6. With this structure, the navigation device makes it easy for the user to determine whether or not a telephone call is possible.

Furthermore, the navigation device can be constructed in such a way as to, when an operation for voice recognition is being performed in the mobile phone 8, display information showing that the call partner is performing a voice recognition operation on the monitor 5. With this structure, the navigation device makes it easy for the user to determine whether or not a telephone call is possible.

Embodiment 3

A navigation device in accordance with Embodiment 3 of the present invention has the same structure as that in accordance with above-mentioned Embodiment 1.

Next, the operation of the navigation device in accordance with Embodiment 3 will be explained. Hands-free call processing and voice recognition processing on a user's voice which are carried out by the navigation device in accordance with this Embodiment 3 are the same as the hands-free call processing (refer to FIG. 2) and the voice recognition processing on a user's voice (refer to FIG. 3) which are carried out by the navigation device in accordance with Embodiment 1, respectively.

Figure 6:
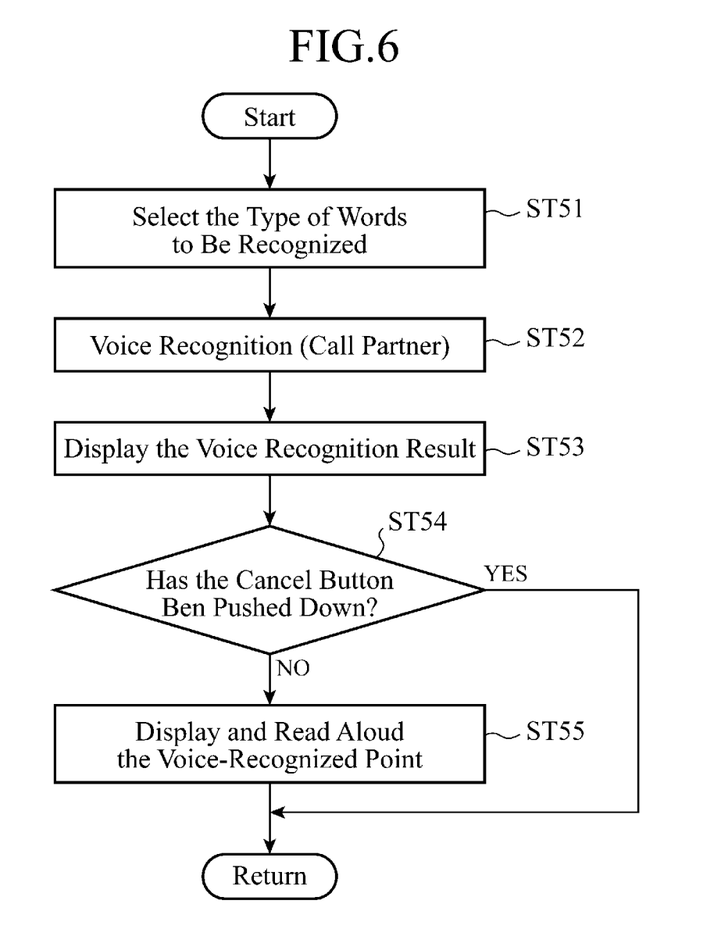
FIG. 6 is a flow chart showing the details of voice recognition processing on a voice uttered by a call partner during hands-free call processing, which is carried out by a navigation device in accordance with Embodiment 3 of the present invention.

FIG. 6 is a flow chart showing voice recognition processing on a call partner's voice which is carried out by the navigation device in accordance with Embodiment 3.

In the voice recognition processing on the call partner's voice, the type of words which the user causes the navigation device to recognize is selected first by the user (step ST51). The process in this step ST51 is the same as that in above-mentioned step ST41. After that, the navigation device performs voice recognition on the call partner's voice without sending any voice guidance to the call partner, and without reducing the sound volume of the call voice (step ST52). The process in this step ST52 is the same as that in above-mentioned step ST44.

The voice recognition result is then displayed (step ST53). The process in this step ST53 is the same as that in above-mentioned step ST46. Whether a cancel button 17 has been pushed down is then checked to see (step ST54). The process in this step ST54 is the same as that in above-mentioned step ST48. When it is determined, in this step ST54, that the cancel button 17 has been pushed down, it is recognized that the recognition result is incorrect, and the navigation device returns the sequence to the hands-free call processing. In this case, the navigation device stops the voice recognition and then returns to a normal talk state.

In contrast, when it is determined, in step ST54, that the cancel button 17 has not been pushed down, it is recognized that the voice recognition result is correct, and the point which has been voice-recognized is displayed on a monitor 5 and is read out (step ST55). The process in this step ST55 is the same as that in above-mentioned step ST49. After that, the navigation device returns the sequence to the hands-free call processing.

As explained above, because the navigation device in accordance with Embodiment 3 of the present invention does not provide any voice guidance to the call partner, the navigation device can perform voice recognition on the call partner's voice for the sake of the user's convenience regardless of the call partner. In addition, because the navigation device in accordance with Embodiment 3 does not have to include the tone signal identifying unit 42 included in the CPU 18, the structure of the CPU 18 can be simplified.

INDUSTRIAL APPLICABILITY

The navigation device in accordance with the present invention can directly acquire point information, personal information or the like which a call partner intends to offer by performing voice recognition on a voice uttered by the call partner. Therefore, the navigation device in accordance with the present invention is suitable for use as a navigation device that guides a user to his or her destination, and that extracts a point or the like automatically by particularly recognizing the call partner's voice.

The invention claimed is:

1. A navigation device comprising:
a communication module for transmitting and receiving a signal to and from external communication equipment;
a tone signal identifying unit for identifying a touch-tone signal sent thereto via said communication module from said external communication equipment, the touch-tone signal indicating a type of content of speech to be transmitted from the external communication equipment;
a voice recognition unit for performing voice recognition on an utterance in a voice signal sent thereto via said communication module from said external communication equipment by using the touch-tone signal;
a voice guidance output unit for outputting a guidance signal, said guidance signal indicating a voice guidance prompting a user of the external communication equipment to speak the utterance upon which the voice recognition is performed;
a microphone for inputting a voice signal to the navigation device; and
a processor for generating a transmission voice using the voice signal input by the microphone, the processor being configured to mix the transmission voice with the guidance signal output by the voice guidance output unit, and supply the communication module with the mixture to transmit said mixture toward the external communication equipment,
wherein the processor includes a sound volume control unit for controlling the transmission voice to reduce volume, said transmission voice being mixed with the guidance signal,
wherein the processor includes a navigation part for acquiring the result of the voice recognition by said voice recognition unit, and performing at least one of a route search and route guidance based on the acquired result, and
wherein the guidance signal outputted by said voice guidance output unit and mixed with the transmission voice indicates another voice guidance which informs said user of the external communication equipment of possible types of content of speech upon which the at least one of the route search and route guidance can be performed.

2. The navigation device according to claim 1, wherein said voice guidance output unit outputs a voice signal as the guidance signal to be mixed with the transmission voice, said voice signal indicating whether or not a result of the recognition performed by the voice recognition unit is correct.

3. The navigation device according to claim 1, further comprising a speaker for outputting voice information indicating that the external communication equipment starts or ends a voice recognition operation.

4. The navigation device according to claim 1, further comprising a speaker for outputting voice from the navigation device,
wherein the voice guidance output unit is configured to output another guidance signal, said another guidance signal indicating a voice guidance for a user of the navigation device,
wherein the processor is configured to mix a reception voice received by the communication module with said another guidance signal, and output the mixture to supply the speaker with said mixture, and
wherein said sound volume control unit controls the reception voice to reduce volume, said reception voice being mixed with said another guidance signal.

5. The navigation device according to claim 1, further comprising a monitor for displaying a message indicating that the external communication equipment is performing a voice recognition operation.

\* \* \* \* \*